United States Patent

Bjornard et al.

[11] Patent Number: 6,068,738
[45] Date of Patent: *May 30, 2000

[54] METHOD AND APPARATUS FOR THIN FILM COATING AN ARTICLE

[76] Inventors: Erik J. Bjornard, 5590 Endwood Trail, Northfield, Minn. 55057; Clifford E. Taylor, 13680 Kvanbeck Trail, Nerstrand, Minn. 55053; Debra M. Steffenhagen, 2525 Tamarisk Dr., Santa Rosa, Calif. 95405; Eric W. Kurman, 509 Matheson St., Healdsburg, Calif. 95448

[ * ] Notice: This patent is subject to a terminal disclaimer.

[21] Appl. No.: 08/970,177

[22] Filed: Nov. 13, 1997

Related U.S. Application Data

[63] Continuation of application No. 08/485,214, Jun. 7, 1995, Pat. No. 5,688,389, which is a continuation-in-part of application No. 08/142,638, Oct. 25, 1993, Pat. No. 5,489,369.

[51] Int. Cl.[7] .......................... C23C 14/34; C23C 16/00; C23C 16/54
[52] U.S. Cl. .............................. 204/192.12; 204/192.26; 204/192.28; 204/298.07; 204/298.11; 204/298.15; 204/298.23; 204/298.25; 204/298.26; 204/298.28; 118/719; 118/720; 118/721; 118/728; 118/729; 118/730; 118/500; 118/504; 427/64; 427/68; 427/69; 427/70; 427/162; 427/163.3; 427/166; 427/255.5
[58] Field of Search ........................... 204/192.1, 192.12, 204/192.26, 192.27, 192.28, 298.07, 298.15, 298.23, 298.25, 298.26, 298.28, 298.11; 118/719, 728, 729, 720, 721, 500, 504, 730; 427/64, 68, 69, 70, 162, 163.3, 166, 248.1, 255, 255.5, 294, 251

[56] References Cited

U.S. PATENT DOCUMENTS

| | | |
|---|---|---|
| 2,093,699 | 9/1937 | Varian et al. ............................ 313/450 |
| 3,294,670 | 12/1966 | Charschan et al. ................. 204/298.25 |
| 3,679,451 | 7/1972 | Marks et al. .......................... 220/2.1 R |
| 3,940,511 | 2/1976 | Deal et al. ................................ 427/165 |
| 3,945,903 | 3/1976 | Svendor et al. .................... 204/192.26 |
| 4,094,764 | 6/1978 | Boucher et al. .................... 204/298.06 |
| 4,274,936 | 6/1981 | Love ................................... 204/192.13 |
| 4,533,449 | 8/1985 | Levenstein ......................... 204/192.26 |
| 4,548,698 | 10/1985 | Sellschopp ......................... 204/298.11 |
| 4,692,233 | 9/1987 | Casey ................................. 204/298.25 |
| 4,755,716 | 7/1988 | Hayafune et al. ...................... 313/478 |
| 4,851,095 | 7/1989 | Scobey et al. ..................... 204/192.12 |
| 4,915,057 | 4/1990 | Boudreau et al. ...................... 118/505 |
| 4,979,919 | 12/1990 | Toyama ..................................... 445/57 |
| 4,982,695 | 1/1991 | Brennesholtz et al. ................. 118/729 |
| 5,084,649 | 1/1992 | Sasao ...................................... 313/474 |
| 5,122,709 | 6/1992 | Kawamura et al. .................... 313/479 |
| 5,133,285 | 7/1992 | Mahler et al. .......................... 118/719 |
| 5,209,690 | 5/1993 | Vriens et al. ............................. 445/52 |
| 5,288,329 | 2/1994 | Nakamura et al. ..................... 118/729 |
| 5,382,126 | 1/1995 | Hartig et al. ............................ 414/217 |
| 5,441,615 | 8/1995 | Mukai et al. ...................... 204/192.12 |
| 5,489,369 | 2/1996 | Bjornard et al. ................... 204/298.25 |
| 5,620,572 | 4/1997 | Bjornard et al. ................... 204/192.12 |

FOREIGN PATENT DOCUMENTS 1146627  6/1989  Japan .

*Primary Examiner*—Rodney McDonald

[57] ABSTRACT

A method, apparatus and carrier for coating a CRT screen after assembly. The method and apparatus includes isolating a surface portion of the CRT to be coated from the remaining surface to prevent or minimize coating problems resulting from outgassing or difficulty in controlling coating process parameters and to isolate noncompatible components from the deposition environment.

19 Claims, 12 Drawing Sheets

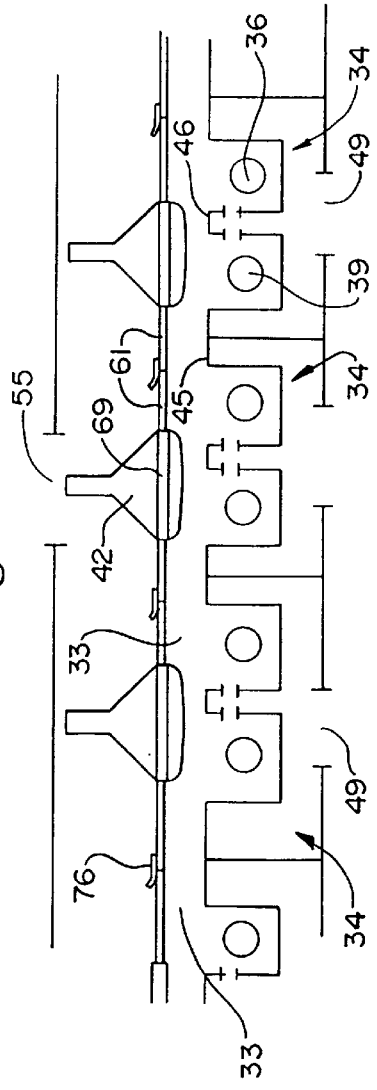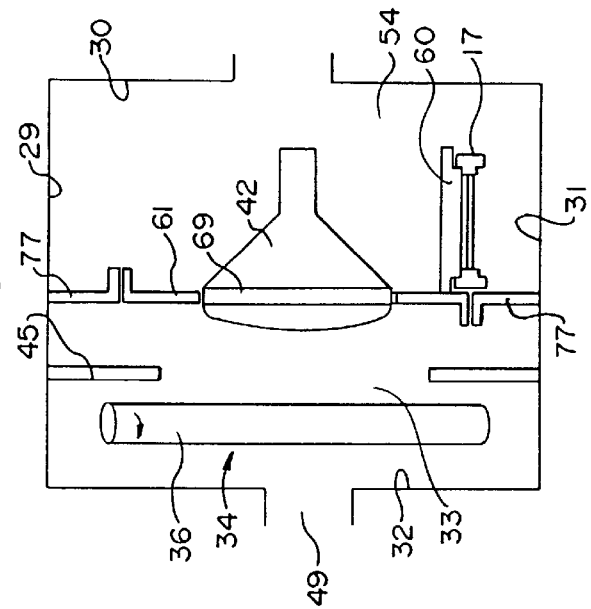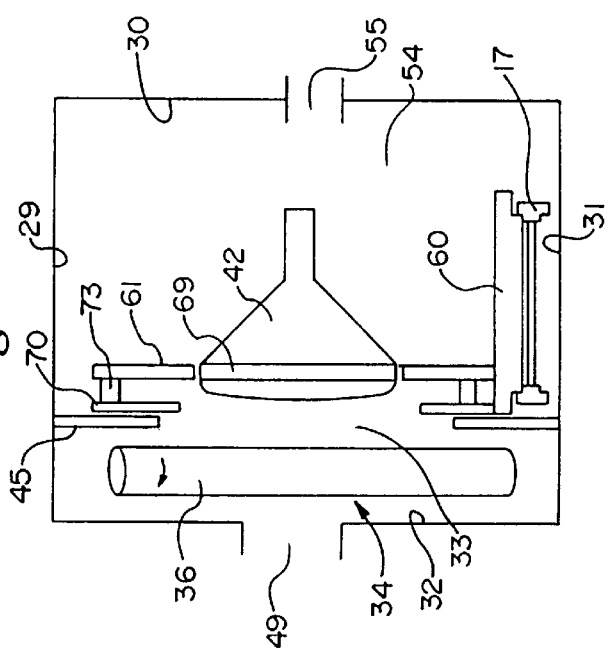

METHOD AND APPARATUS FOR THIN FILM COATING AN ARTICLE

RELATED APPLICATION

This application is a continuation of Ser. No. 08/485,214 filed Jun. 7, 1995 now U.S. Pat. No. 5,688,389 which is a continuation-in-part of Ser. No. 08/142,638 filed Oct. 25, 1993, now U.S. Pat. No. 5,489,369.

BACKGROUND OF THE INVENTION

1. Field of the Invention

The present invention relates generally to a method and apparatus for applying a thin film coating to an article and more particularly to a method and apparatus for providing a thin film coating to a portion of an article while substantially isolating other portions of the article from the coating environment. In a preferred embodiment, the present invention relates to a method and apparatus for applying a thin film coating to the front face of a cathode ray tube (CRT) after assembly using a thin film deposition technique such as sputtering. The invention also relates to an article carrier for use in such method and apparatus.

2. Summary of the Prior Art

Although the invention has general application to the thin film coating of an article through a variety of thin film deposition techniques such as electron beam deposition, chemical vapor deposition and sputtering, among others, it has particular applicability to the application of a thin film anti-reflective or other coating onto the front face or screen of a CRT after assembly.

A major objective of designers and manufacturers of displays using CRTs is to reduce glare resulting from the reflection of ambient light off the CRT face. Several approaches have been used in the prior art to achieve glare reduction on CRT screens. One approach has involved surface treatment of the screen by chemical etching such as by means of a hydrofluoric acid solution. Examples are disclosed in U.S. Pat. Nos. 3,679,451 issued to Marks et al. and 3,941,511 issued to Deal et al. Both methods seek to reduce glare from the CRT face by providing a treated surface which scatters incident light while still maintaining good transmittance of light emanating from the CRT face. In general, however, anti-reflective coatings applied through chemical etching achieve only minimal glare reduction and usually result in degradation of the resolution.

A further approach to glare reduction has been to provide a CRT with an anti-glare filter consisting of a piece of glass or other material having an anti-reflective view surface. The filter is placed in a frame and suspended in front of the CRT view surface. In such a device, the glass filter may be tinted or bear an absorbing coating to provide contrast enhancement. Such a device is known as a contrast enhancement filter. Coatings onto the glass filter may also be in the form of optical interference coatings applied to the glass surface by means of physical vapor deposition methods such as sputter and evaporative deposition. They may also be applied by means of chemical vapor or by liquid deposition methods such as spin or dip coating.

A third approach has been to apply optical interference coatings to a CRT screen prior to assembly into a finished unit. For such method to be successful, however, the applied coating must be able to survive the subsequent processing steps during assembly of the unit. The most challenging of these subsequent processing steps is the "frit sealing" step in which the face plate is sealed to the funnel of the CRT by using a paste comprised of glass and ceramic particles. The temperatures needed for the frit seal process may be as high as 450° C. Many optical interference coatings will undergo an irreversible and deleterious alteration of their properties on exposure to these processing conditions. Such changes may also alter optical thicknesses and electrical conductivity optical constants of several of the layers, thereby resulting in a loss of desired optical or electrical conductivity properties.

A still further approach known in the art for providing a CRT screen with anti-reflective properties is to coat a piece of glass with an anti-reflective coating and then bond the glass directly to the CRT. Such a process is known in the art as bonded panel construction. Such processes are expensive since they require a precision bent glass substrate and can result in significant yield loss because of the CRTs and panels which must be discarded due to imperfections in the process.

A desirable feature of anti-reflective coatings intended for CRT face plates or glare filters regardless of the application process, is electrical conductivity. Such conductivity should preferably be sufficient to facilitate the dissipation of static electrical charges and thereby reduce accumulation of dust on the CRT or filter.

Electrically conductive coatings are not possible with methods involving chemical etching. Even with the other processes described above, where electrically conductive coatings are possible, additional time consuming processing steps must be undertaken to electrically connect the coating to the implosion band or other grounding component so that the static charges can be dissipated.

Attempts to directly coat the face plates of CRTs or other similar articles after assembly have not proven to be successful. Several reasons exist for this. First, many of the materials and components in the finished CRT are not compatible with the conditions existing in a thin film deposition environment such as, for example, magnetron sputter deposition environments. Second, an assembled CRT embodies various polymeric materials including electronic and other components at the rear of the CRT. These tend to "outgas" or release volatile contaminants when subjected to the heat, vacuum and ion bombardment of thin film deposition environments. Such volatile contaminants may include water vapor, plasticizers, solvents and oligomers. The presence of these outgas components adversely affect the coating process and operation of the deposition equipment. This in turn adversely affects the quality and characteristics of the anti-reflective coating. Although outgassing can be reduced by exposing the assembled CRT to vacuum conditions for an extended period prior to coating, this is time consuming and expensive.

Further, CRTs or other articles having a significant depth or thickness dimension relative to the surface portion being coated necessarily dictate the need for a relatively large process chamber in which the CRT or other article is positioned, or through which the CRT or other article passes, during the coating process. With a large process chamber, the maintenance of the coating process parameters at the desired and optimum levels is difficult. Further, as the size of the process chamber increases, conductance between adjacent cathodes increases. Failure to accurately and consistently control the coating process parameters and to minimize conductance or contamination between adjacent cathodes results in inferior coatings.

Still further, coating of the rear surface or funnel portion of the CRT should be avoided to prevent possible short-out situations.

Accordingly, there is a need in the art for an improved method and apparatus for providing the face plate or screen of CRTs and other articles with an anti-reflective or other coating which is cost effective and which overcomes the problems currently existing in the prior art. A more specific need exists for a method and apparatus for directly coating a CRT face plate or other article after assembly with a highly acceptable coating without regard to interference by outgassing from assembled CRT components and without regard to the incompatibility of such components to the deposition environment. A still further need exists for a method and apparatus for coating a CRT face plate or a selected portion of other articles in which the coating process parameters can be accurately and consistently controlled and conductance between adjacent cathodes or other coating devices can be minimized.

SUMMARY OF THE INVENTION

In contrast to the prior art, the present invention provides a method and apparatus for direct coating of an article such as a CRT face plate or screen, after assembly, by a thin film deposition technique such as magnetron sputtering. This is accomplished by substantially isolating noncompatible and outgas producing components of the assembled CRT from the deposition environment, thereby preventing exposure of the noncompatible components to the deposition chamber and significantly reducing, if not eliminating, outgassing problems which would otherwise adversely affect the deposition process and coating quality. The method and apparatus of the present invention also provide a means for effectively reducing the size and dimensions of the deposition zone of the process chamber so as to facilitate control and maintenance of the coating process parameters and minimize conductance between adjacent cathodes. Still further, the method and apparatus of the present invention facilitates direct coating of the face plate of a CRT with a conductive coating which connects with a buss bar or the like for ultimate connection to the implosion band or other grounding component, thereby providing an efficient method and apparatus for electrically connecting the coating with a static dissipating connection.

In accordance with the preferred embodiment of the method and apparatus of the present invention, the CRT or other article to be coated is processed in a thin film deposition system in which the CRT face plate or that part of an article which is to be coated is exposed to a deposition environment and the remainder is substantially isolated from such environment. In the preferred embodiment, this is accomplished by supporting the CRT so that its front face is exposed to a plurality of deposition process zones and by providing a moving, substantially continuous barrier which substantially isolates the non-coated portion of the article from the deposition environment and thus limits exposure of the deposition environment to the portion of the article to be coated. Reduction in the migration or movement of outgasses and other contaminants into the deposition zone may also be accomplished by maintaining a partial pressure differential between the deposition and exhaust zones, either alone or in combination with the barrier. Such barrier also effectively reduces the size and dimensions of the deposition zone, thereby facilitating improved control of the coating process parameters.

In the most preferred method and apparatus, the present invention provides a continuous, in-line processing system in which CRTs or other articles to be coated are continuously passed through the system. The system includes an entry and an exit buffer chamber and a plurality of coating devices defining a deposition zone to which the CRT face plates are exposed during passage through the system. The components of the CRT which are not compatible with the deposition environment as well as the possible outgassing sources are substantially isolated from the deposition zone by the moving barrier.

Accordingly, it is an object of the present invention to provide an improved method and apparatus for providing a CRT face plate or a selected portion of another article with an anti-reflective or other coating.

Another object of the present invention is to provide a method and apparatus for directly coating the face plate of a CRT or other article after assembly.

A still further object of the present invention is to provide a method and apparatus for directly providing a CRT face plate with an anti-reflective coating which is electrically conductive and in which the coating is electrically connected with a dissipation contact such as a buss bar or the like.

A still further object of the present invention is to provide a method and apparatus for directly providing a CRT face plate with an anti-reflective coating via sputtering in which the coating can be applied after assembly without concern for outgassing problems.

Another object of the present invention is to provide a dynamic or moving barrier through the process chamber of the coating apparatus to facilitate accurate and consistent control of the coating process parameters and to minimize conductance between adjacent coating devices.

Another object of the present invention is to provide a CRT carrier for use in a method and apparatus for coating a CRT.

These and other objects of the present invention will become apparent with reference to the drawings, the description of the preferred method and apparatus, and the appended claims.

DESCRIPTION OF THE DRAWINGS

FIG. 15 is a schematic top illustration, similar to claim 7, showing an alternate embodiment of the barrier means for separating the deposition and exhaust zones.

FIG. 16 is a schematic end illustration of the embodiment shown in FIG. 7.

FIG. 17 is a schematic end illustration of the embodiment shown in FIG. 15.

DESCRIPTION OF THE PREFERRED METHOD AND APPARATUS

The present invention relates to a method and apparatus for applying a thin film coating to an article and a carrier for use in such apparatus and method. More particularly, the method and apparatus relates to applying a coating to a first surface portion of such article while substantially isolating the remaining surface portion of such article. It is contemplated that the present invention has applicability and can be used to apply such a coating to a variety of articles where selective coating of a portion of the article is desired; however, the present invention is particularly effective in applying a thin film coating onto the screen or front face of a CRT or in applying a thin film coating to an article having a significant dimension in a direction perpendicular to the surface being coated. Further, although the method and apparatus can be used to apply such a coating at various stages of assembly, it has particular advantages when applied to the screen of a partial or fully assembled CRT, to other articles where the noncoated surfaces provide outgas sources or have a significant depth dimension, or to other articles where it is important to maintain relatively constant operating pressures.

Except as specifically limited, the reference in the present application to a thin film deposition device or process is intended to include all devices and equipment capable of applying a thin film coating. Included are devices such as electron beam deposition devices, chemical vapor deposition devices and sputtering devices, among others. The preferred embodiment of the present invention, however, is described with respect to a DC or AC magnetron sputtering device. Further, a variety of coatings can be applied including antireflective coatings, conductive coatings for touch screens and the like. The preferred coating, however, is an antireflective coating.

Figure 1:
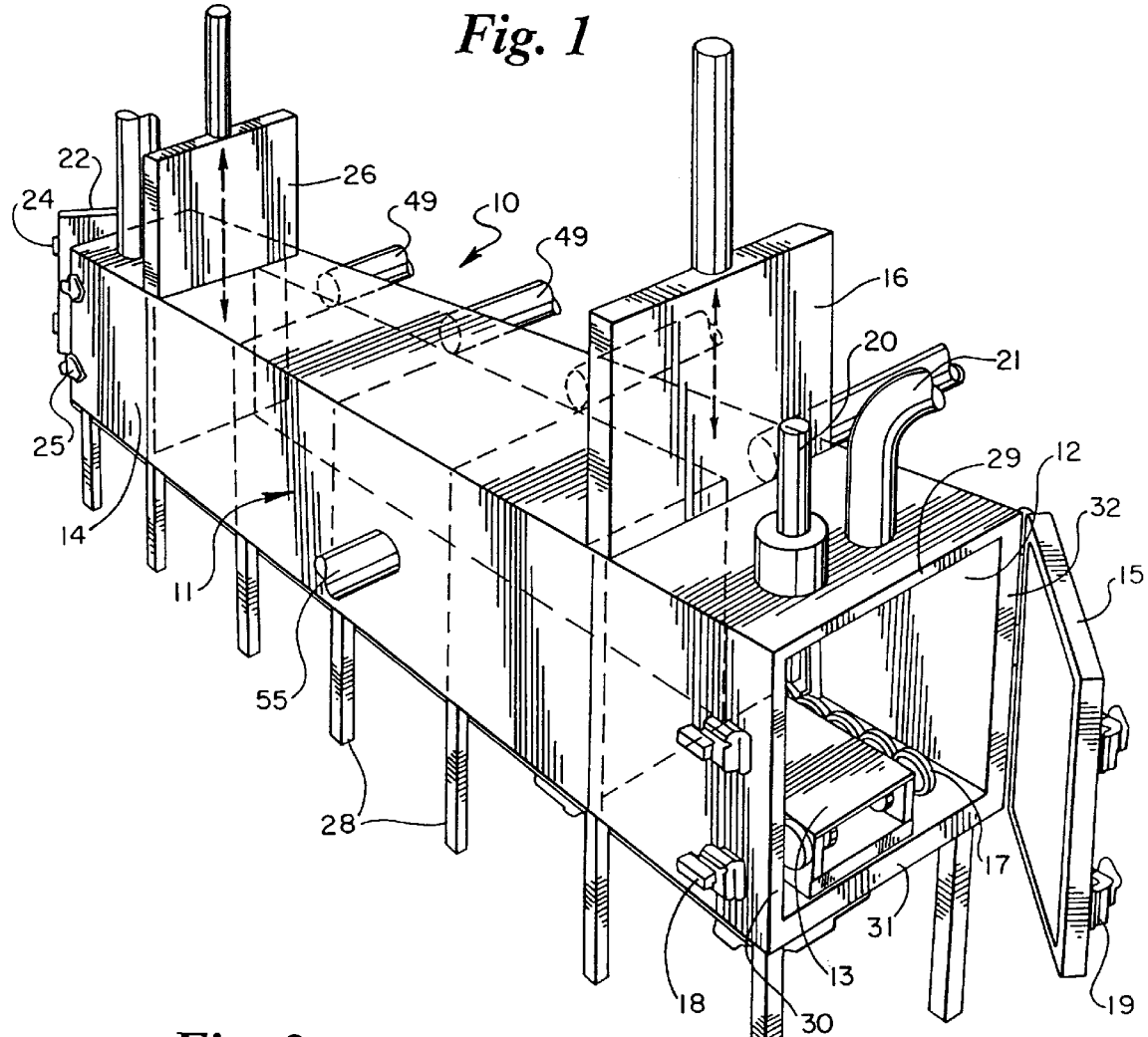
FIG. 1 is a perspective view of the apparatus of the present invention.

General reference is first made to FIG. 1 comprising a perspective view of the preferred apparatus 10 of the present invention. The apparatus 10 includes an elongated housing with a centrally positioned process chamber or section 11 and end sections comprising entry and exit buffer chambers 12 and 14, respectively. The entry buffer chamber 12 is provided with an access door 15, with latch members 18 and 19 and with a slit or gate valve 16 for selectively isolating the interior of the chamber 12 from the process chamber 11. The chamber 12 is also provided with air supply means 20 and air exhaust means 21 for selectively providing ambient pressure conditions or vacuum conditions within the chamber 12. Similarly, the exit buffer chamber 14 is provided with a hinged door 22, latch members 24 and 25, a slit or gate valve 26 and air supply and exhaust means. Both chambers 12 and 14 function as buffer zones or chambers to facilitate entry of an article to be coated into, or exit of the coated article from, the process chamber 11.

The apparatus 10 is supported on a plurality of legs 28 and is provided with a top wall 29, a bottom wall 31 and a pair of side walls 30 and 32. Positioned within, and extending the entire length of, the apparatus 10 is a linear drive mechanism 13 having a plurality of spaced, rotatable wheels 17 for transporting the CRT carrier through the apparatus as will be described below.

Figure 7:
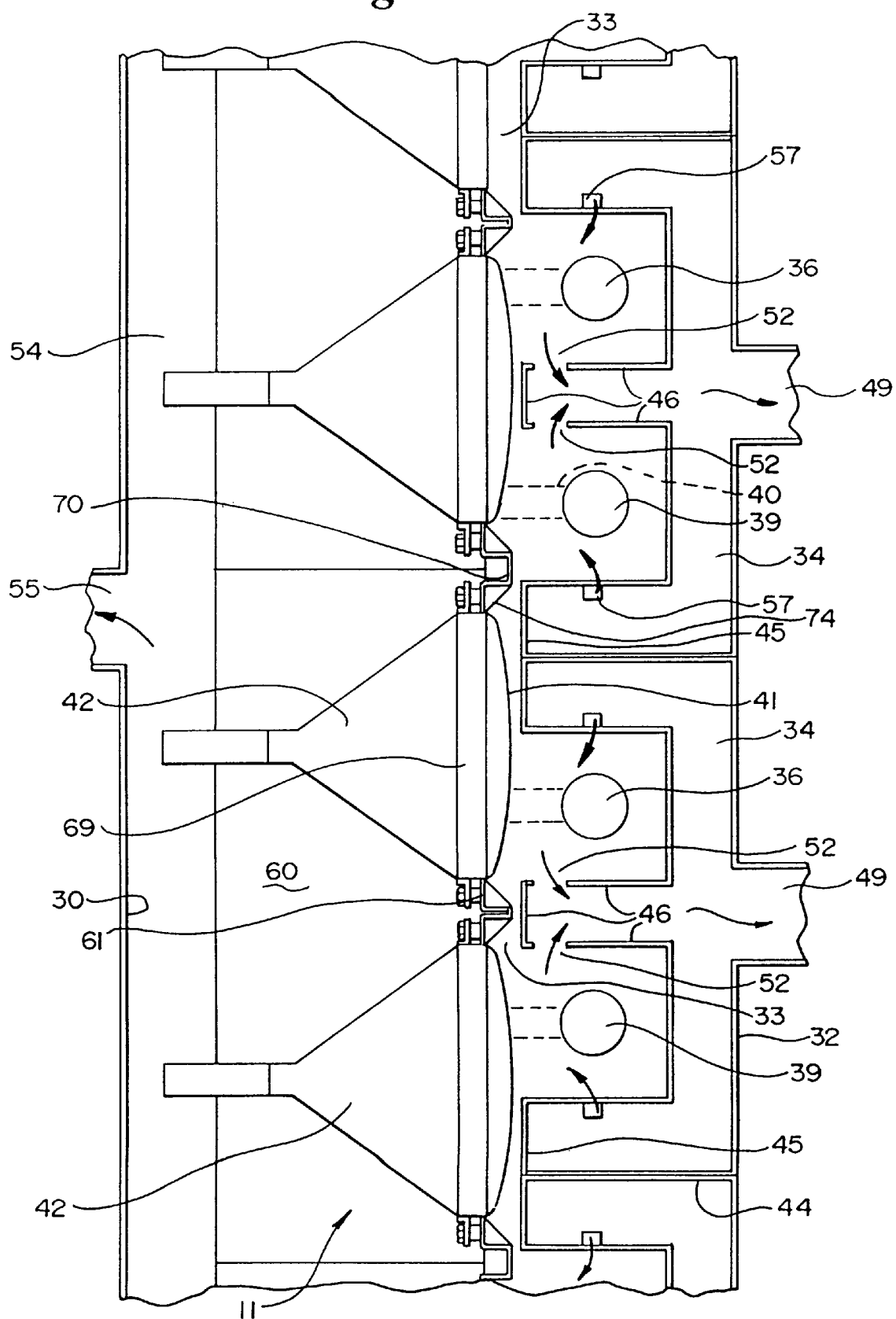
FIG. 7 is a top schematic illustration of the processing section of the apparatus of the present invention showing a plurality of coating devices and a plurality of double CRT carriers being moved through the apparatus.
Figure 9:
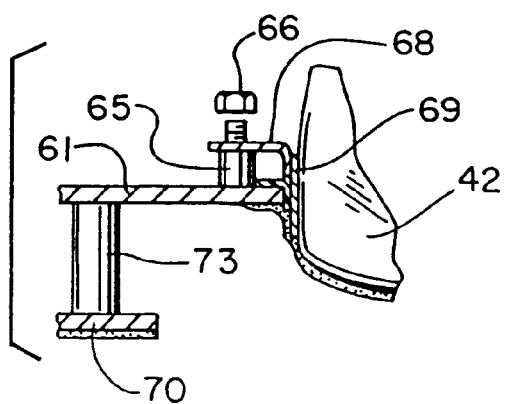
FIG. 9 is an illustration similar to that of FIG. 8 showing an alternate embodiment of the connection between the CRT and the CRT carrier.

The interior of one embodiment of the process chamber 11 of the apparatus 10 is illustrated schematically in FIGS. 7 and 16 and includes a plurality of side-by-side coating devices 34. Each of these devices 34 is provided with at least one thin film deposition device which, in the preferred embodiment, is a sputtering cathode 36. Preferably, each of the coating devices 34 is provided with a pair of sputtering cathodes 36 and 39. The cathodes 36 and 39 are rotatable cathodes which are constructed of a target material and function in accordance with technology known in the art. During operation, each of the cathodes 36 and 39 emits atoms or other small particles 40 for deposition onto the front screen 41 of a CRT 42 or other article to be coated.

Each of the coating devices 34 is defined in part by a pair of end walls 44, the inner wall portions 45 including the cathode shielding wall portions 46, and the outer side wall 32. The outer side wall 32 includes a port 49 for evacuating gases from the chamber defining the interior of the coating devices 34 as described in greater detail below. In the system schematic of FIG. 11, each of the evacuation ports 49 is connected with an evacuation or process zone pump 50. Depending upon various factors, including the particular reactive gases employed in each of the coating devices 34, it is possible for several of the outlet ports 49, or in some cases all of the ports 49, to be connected with a common pump 50.

The plurality of coating devices 34 are positioned generally in line and adjacent to one another to facilitate a continuous coating process. During operation, working or reactive gases are supplied to the sputtering cathodes 36 and 39 by means of a plurality of distribution manifolds 57. These manifolds direct the working gases toward the magnetron cathodes 36 and 39, causing emission or reaction of the particles 40 for deposition onto the CRT face 41.

Following bombardment of the cathodes 36 and 39, the working gases flow through the openings 52 in the cathode shielding portions 46 and are then evacuated through the evacuation port 49.

Positioned between the coating devices 34 and the front faces 41 of the CRTs 42 and within the process chamber 11 is a deposition zone 33. The deposition zone 33 is defined on one side by the coating devices 34 and on the other side by the CRT screens 41 and the carrier barrier plates 61. As will be described in greater detail below, the barrier plates 61 of the carriers 58 cooperate with adjacent carrier plates 61 and with the top and bottom walls 29 and 31 to form a substantially continuous moving barrier extending throughout a substantial portion of the length of the chamber 11.

Adjacent to the deposition zone 33 and positioned between the zone 33 and the side wall 30 is an isolation or exhaust zone or plenum 54. The zone 54 extends the entire length of the process section 11 (FIG. 1) and is defined on its ends by the gate valves 16 and 26 and on its top and bottom by the top wall 29 and bottom wall 31 of the apparatus 10. One of its sides is defined by the side wall 30, while its other side is defined by various barrier plates 61 of the CRT carriers. The zone 54 is provided with a single outlet port 55 although multiple ports can be provided if desired. As illustrated in the schematic diagram of FIG. 11, a separate exhaust pump or system 56 is connected with the port 55 for removing outgassing products and/or generating reduced pressure within the zone 54.

Figure 2:
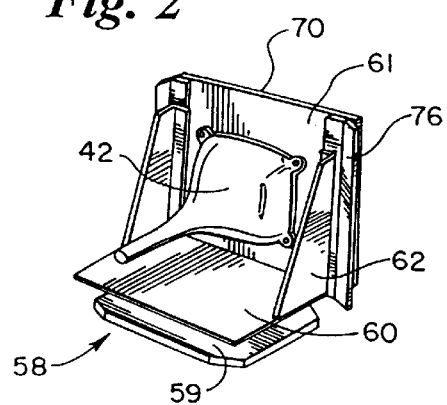
FIG. 2 is an isometric view of the rearward side of a CRT carrier usable in the apparatus illustrated in FIG. 1 with a CRT mounted therein.
Figure 4:
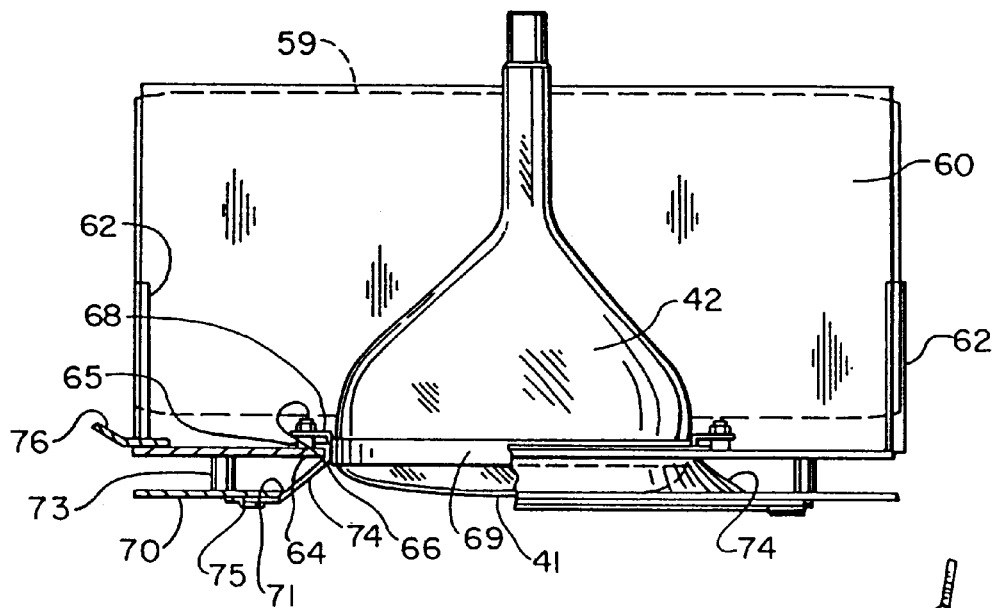
FIG. 4 is a top view, partially in section, of the CRT carrier of FIG. 2.
Figure 3:
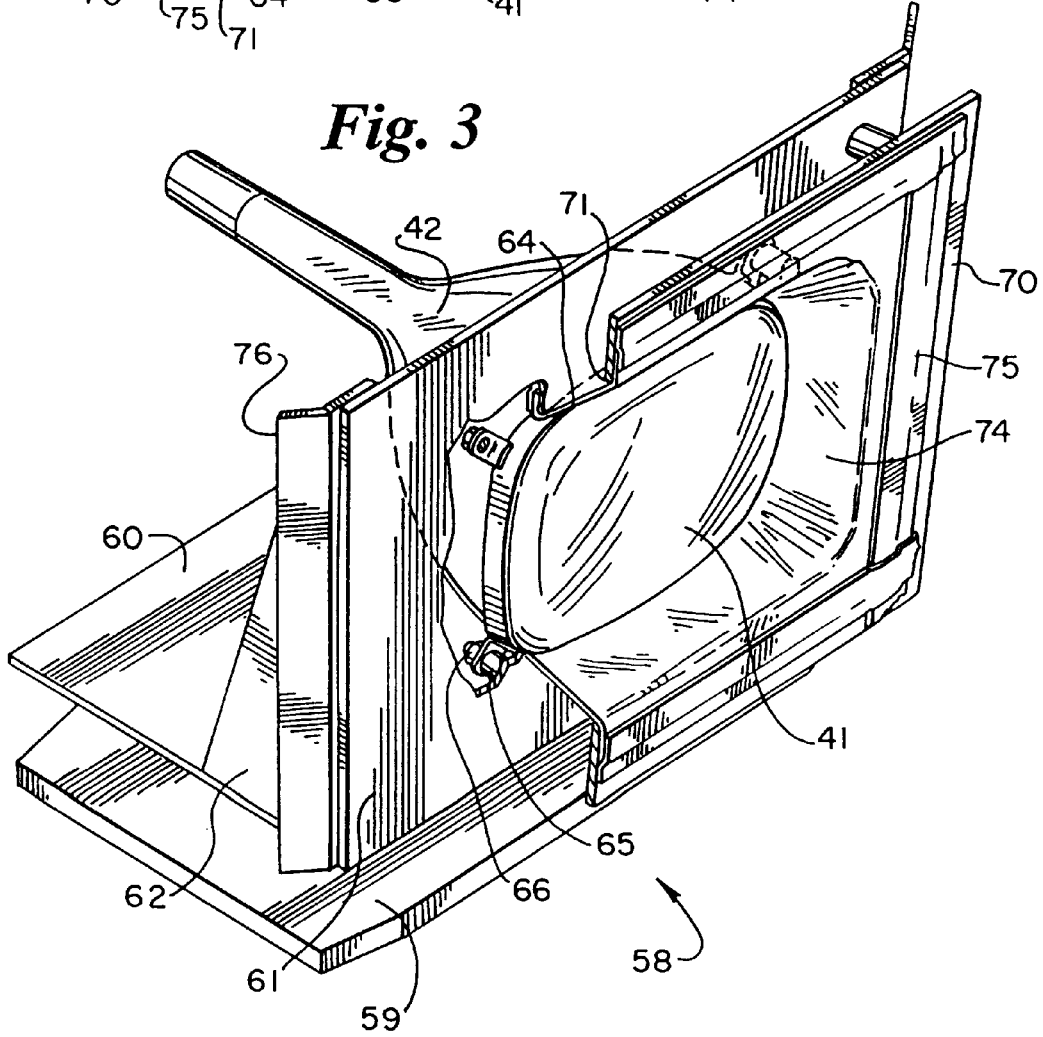
FIG. 3 is an isometric view of the front side of the CRT carrier of FIG. 2 with portions broken away.

As illustrated best in FIGS. 2, 3 and 4, a CRT carrier 58 supports a CRT 42. When used with the apparatus 10 of FIG. 1, a plurality of carriers 58 transport the CRTs 42 past the coating devices 34 for coating. At the same time, the carriers 58, in conjunction with adjacent carriers and with portions of the apparatus 10, form a substantially continuous, moving barrier to substantially isolate the deposition zone 33 from the exhaust zone 54 and thus the portions of the CRT 42 which are to remain uncoated. This substantially reduces or eliminates outgassing problems and facilitates the coating of CRT screens following assembly. It also effectively reduces the deposition zone size of the process chamber 11 so that process parameters can be more accurately and consistently controlled.

Figure 8:
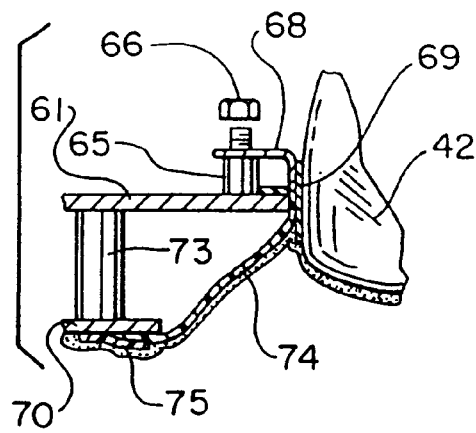
FIG. 8 is an enlarged illustration showing connection between the CRT and the CRT carrier of FIG. 2.

The carrier 58 includes a base 59 and a CRT support comprised of a bottom 60, a pair of side brackets 62 and a front, generally rectangular barrier plate 61. The bottom 60 is connected with the base 59 by appropriate connection means. The brackets 62 are secured to the bottom 60 and to the rearward surface of the plate 61 by welding or the like to support the plate in a generally vertical orientation at right angles relative to the bottom 60. As illustrated best in FIGS. 3 and 4, the barrier plate 61 is provided with a central opening 64 conforming substantially in size and configuration to a peripheral surface of the CRT 42. As shown in FIG. 8, the rearward surface of the plate 61 is provided with a plurality of standoffs 65 and threaded members 66 for connection with tabs or ears 68 extending from the implosion band 69 of the CRT. With this structure, the CRT 42 can be mounted relative to the barrier plate 61 with the face or screen 41 of the CRT 42 extending through the opening 64 and the remaining portion of the CRT 42 extending to the rear of the plate 61. Preferably, the barrier plate 61 engages the implosion band 69 in a sealing relationship by an elastomeric seal or the like so as to preclude passage of any outgas or other material between the opening 64 and the CRT 42 or band 69. In some cases, however, a small gap between the barrier 61 and the implosion band 69 can be tolerated if the quantity or partial pressure vapors, etc. of gases passing between the exhaust zone 54 and the process zones 34 are insignificant in comparison with the quantities or partial pressures of the reactive gases supplied to the sputter deposition process.

Figure 10:
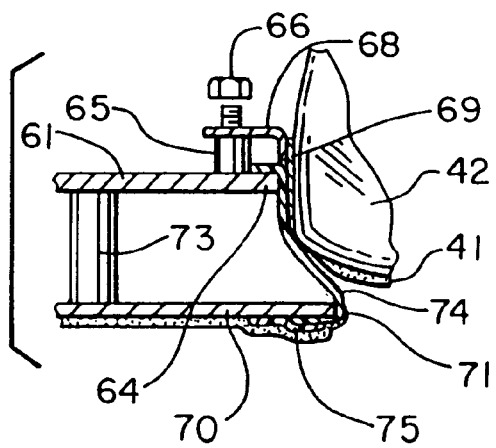
FIG. 10 is an illustration similar to that of FIG. 8 showing a further embodiment of the connection between the CRT and the CRT carrier.

Positioned forwardly of the barrier plate 61 is a generally rectangular mask or shield member 70 having a central opening 71 and top, bottom and side edges. The member 70 is mounted in spaced relationship relative to the plate 61 by a plurality of standoff members 72. In the preferred embodiment, the central opening 71 is generally aligned with the opening 64 of the plate 61 but is larger as illustrated best in FIGS. 3, 4, 5 and 8. Preferably, the shield member 70 is spaced forwardly from the barrier plate 61 a distance at least as great as the distance which the front face or screen 41 extends forwardly of the plate 61. A section of Kapton film 74 may be provided between the opening 71 of the mask 70 and the opening 64 of the barrier 61 to improve the separation and the isolation of the front face 41 of the CRT from the exhaust zone 54. The film 74 is secured to the front face of the mask 70 by a plurality of tape strips 75. As shown best in FIG. 8, the film 74 extends inwardly from the opening 71 and then past the opening 64. If needed or desired, the film 74 is retained relative to the barrier plate 61 by a plurality of tape strips (not shown). Preferably the film 74 is positioned relative to the front face 41 so that when the CRT is exposed to the deposition device, the coating extends over the entire front face 41 as well as a portion of the implosion band 69. Although provision of the film 74 is desirable, it is not necessary as shown in several of the alternate embodiments. Further, as shown in FIG. 10, the opening 71 in the mask member 70 may be smaller than the opening 64 if a reduced portion of the front face 41 is desired to be coated.

Figure 6:
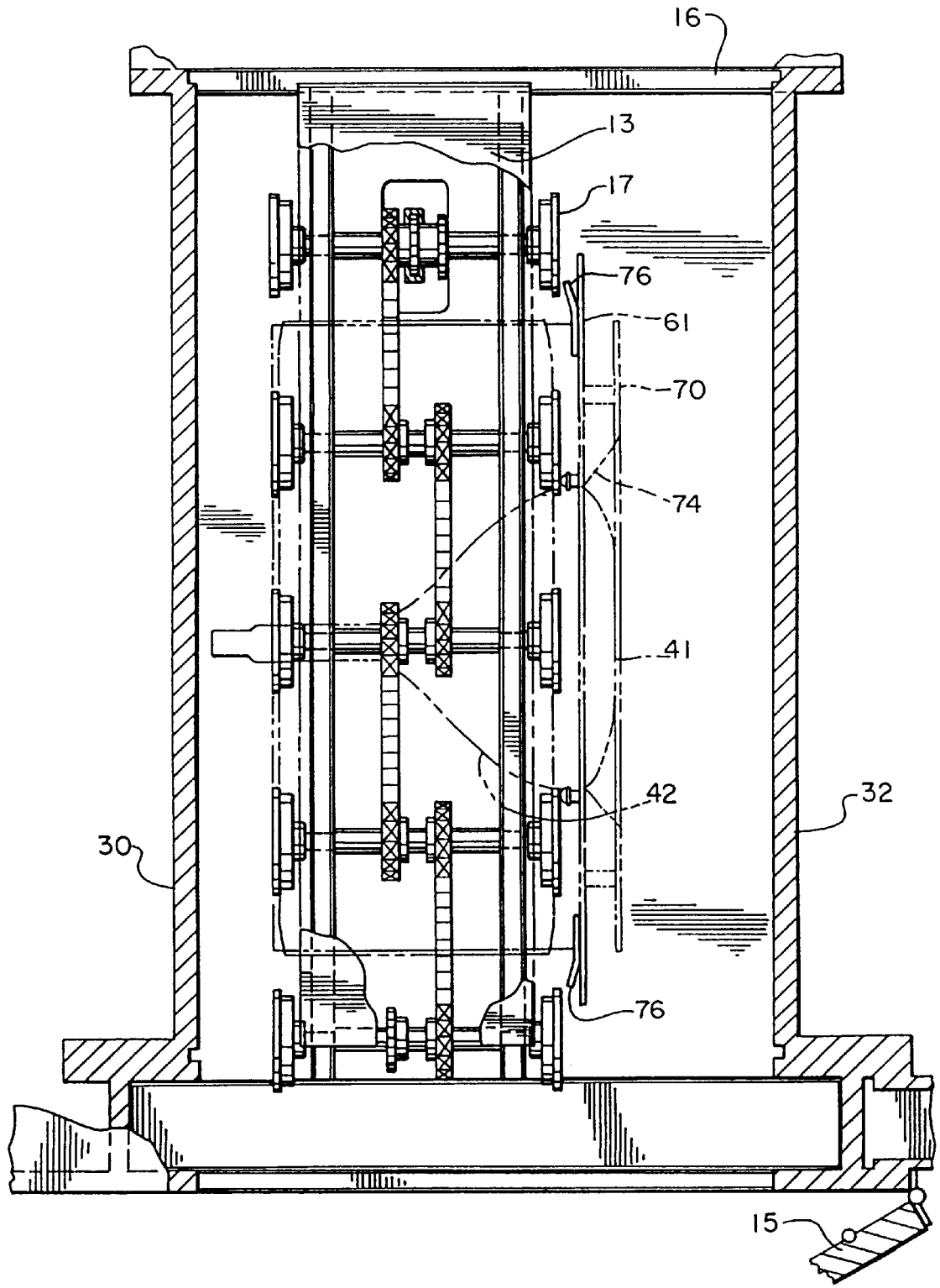
FIG. 6 is a top elevational view, with parts broken away, showing the linear drive mechanism for the CRT carriers and showing the CRT and CRT carrier of FIG. 2 in phantom within the entry buffer chamber.

Secured to one side of the barrier plate 61 is an overlapping edge tab 76 having an outer edge which is bent away from the plate 61 so as to overlap the plate 61 from an adjacent carrier as shown in FIG. 6. As best shown in FIG. 16, the shield 70 should be positioned as close to the wall 45 and shield portions 46 as possible. Further, the side edges of adjacent shield members 70 and adjacent barrier plates should be positioned as close together as possible. Minimizing the gap between these surfaces not only maximizes the isolation and separation between the exhaust and deposition zones 54 and 33, but, in the case of the gap between the shield 70 and the wall portions 45 and shield portions 46, also minimizes the conductance or contamination between adjacent coating devices 34.

FIGS. 15 and 17 illustrate an alternate embodiment for separating the deposition and exhaust zones. In this alternate embodiment, the shield member 70 of the embodiment of FIGS. 7 and 16 has been eliminated and mating separation panel or barrier portions 83 are provided. The barrier portions 83 (shown best in FIG. 17) are connected with walls 29 and 31 and extend along the entire length of the process section 11. The portions 83 mate with top and bottom edges of the barrier plate 61. In the preferred embodiment, the top and bottom edge of the plate 61 and portions 83 extend laterally to improve separation between the deposition and exhaust zones. The side edges of the barrier plates 61 of adjacent carriers in the embodiment of FIGS. 15 and 17 should be positioned as close as possible to minimize the gap between them and thus prevent, or at least minimize, transmission of gases from the exhaust zone 54 to the deposition zone 33. To further improve separation, an edge tab 76 may be provided between the barrier plate side edges of adjacent carriers 58.

Figure 12:
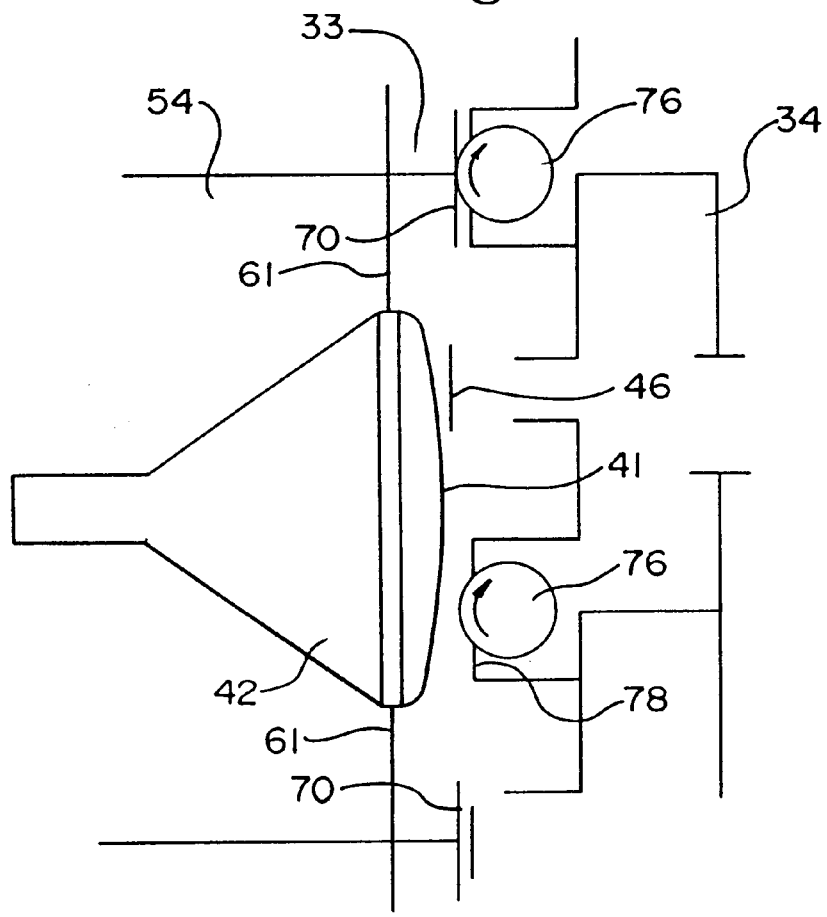
FIG. 12 is a schematic illustration of a modified structure showing means for improving separation between adjacent coating devices.

FIG. 12 illustrates a structure for obtaining improved separation or isolation between adjacent coating devices 34.

Such isolation may be desirable in cases where different working or reactive gases are used. In FIG. 12, a sealing roller 76 is mounted such that a portion extends through an opening in the wall portion 78. By providing a shield or barrier 70 of sufficient length, a seal is formed between the rollers 76 and the shield 70 as the CRTs 42 move through the apparatus. Such a structure effectively forms a seal, and thus prevents the flow of gases, etc., between adjacent coating devices 34.

Figure 13:
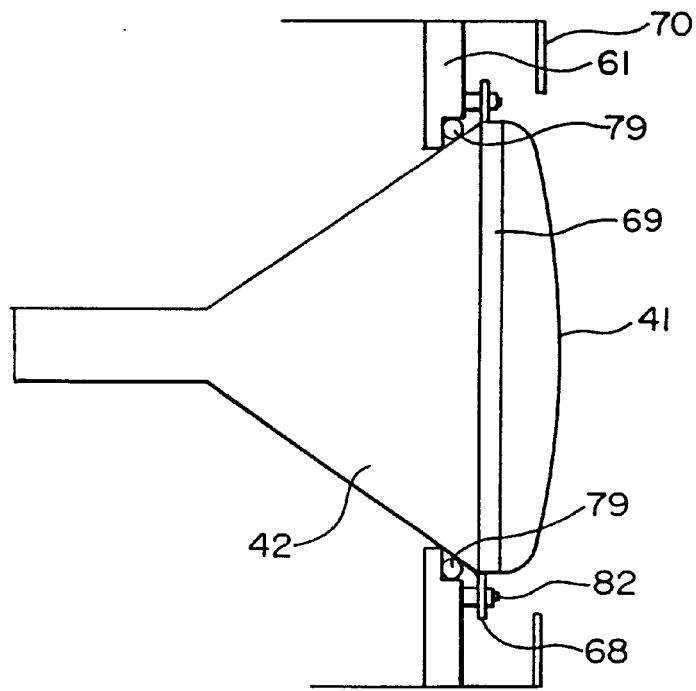
FIG. 13 is a schematic illustration showing an alternate embodiment of a seal means between the CRT and CRT carrier.

FIG. 13 is an illustration of an alternate apparatus for mounting the CRT 42 relative to the carrier and for sealing the same relative to the barrier plate 61. In the embodiment of FIG. 13, an elastomeric seal member 79 engages a portion of the CRT 42 rearwardly of the implosion band 69. The CRT 42 is supported relative to the barrier plate 61 by the threaded members 82 attached to peripheral ears 68 commonly provided around the CRT periphery. This particular embodiment is preferred when outgassing contaminants resulting from the implosion band 69 can be kept to a minimum. An advantage of this particular embodiment is that the conductive coating applied to the front screen 41 of the CRT 42 can be connected to a buss bar or the like, thereby insuring electrical contact between the conductive coating and the band 69 and dissipating static electricity.

Figure 14:
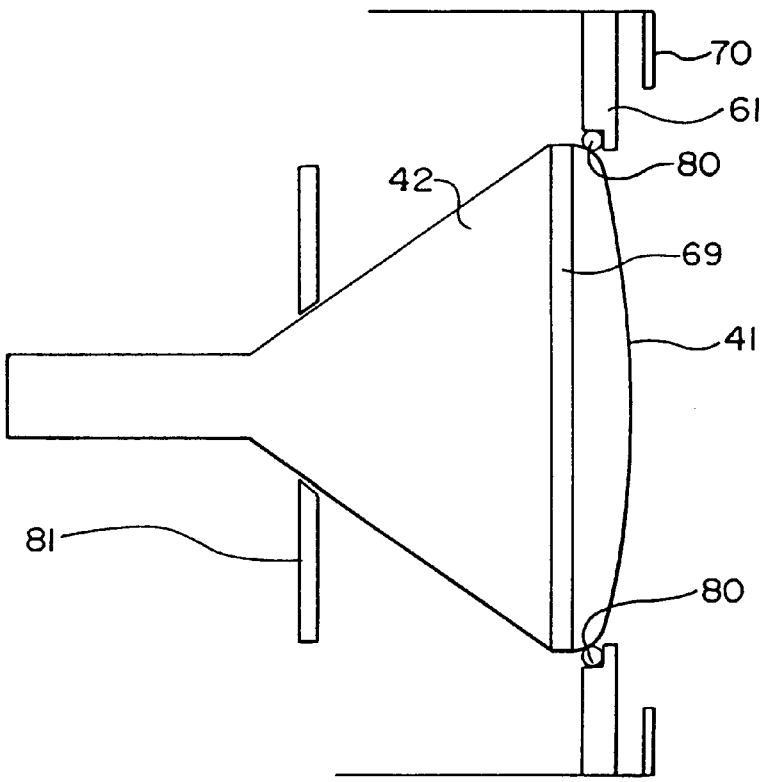
FIG. 14 is a schematic illustration showing a further embodiment of a seal means between the CRT and CRT carrier.

FIG. 14 illustrates a further embodiment for supporting the CRT 42 relative to the carrier and forming a seal between the barrier plate 61 and a peripheral edge of the CRT screen 41. In the embodiment of FIG. 14, an elastomeric seal 80 is positioned forward of the implosion band 69. An advantage of this embodiment is that it isolates the implosion band 69 from the deposition zone 34 and thus prevents or minimizes the band 69 as a source of outgassing. The sealing force and CRT support in the embodiment of FIG. 14 is provided by a yoke or collar 81 which is pressed against a rear surface portion of the CRT 11 by means of springs, etc. In all embodiments, however, a substantially continuous, moving barrier is formed in the process chamber separating the exhaust and deposition zones.

Figure 18:
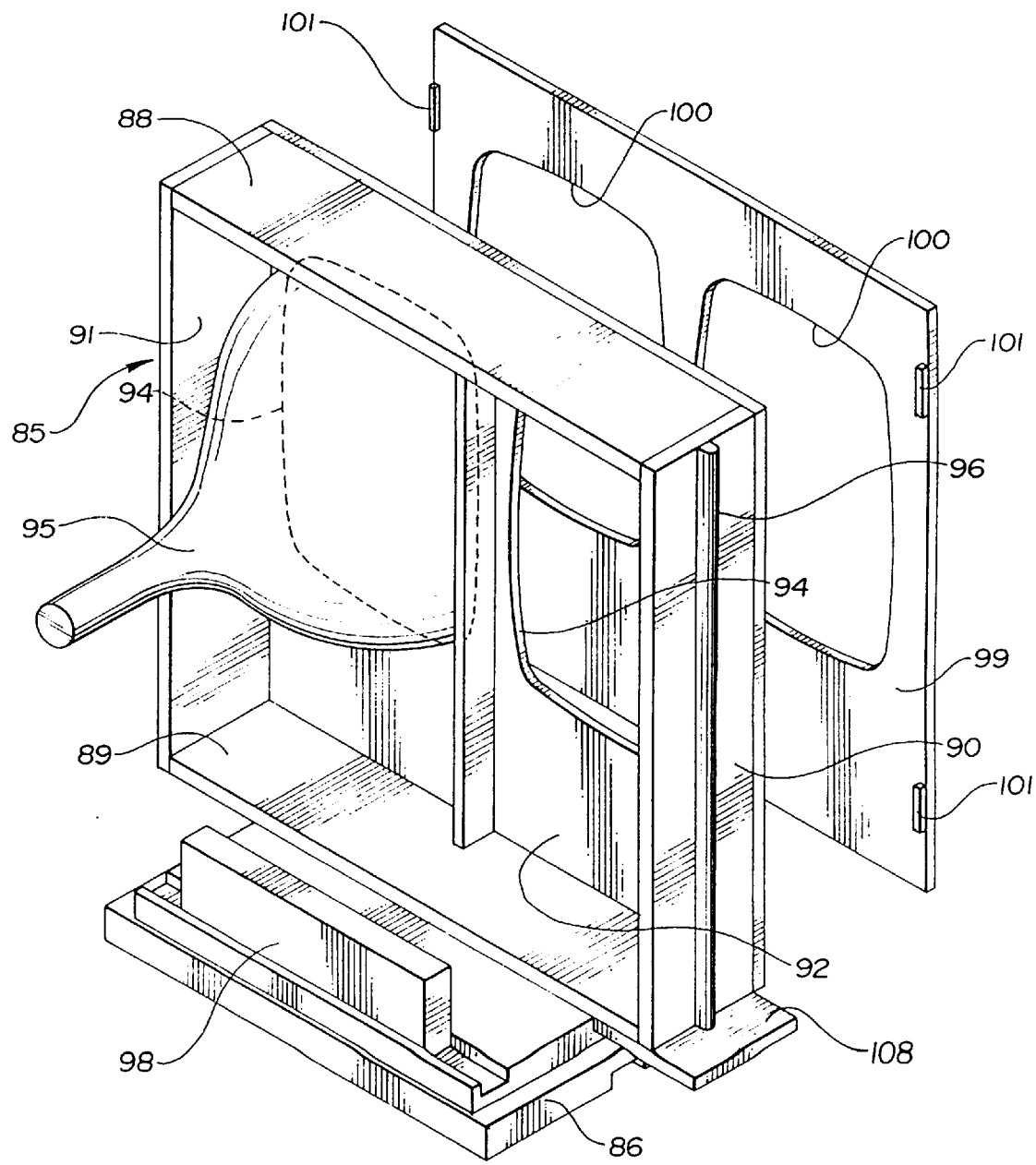
FIG. 18 is an isometric view of an alternate carrier design with a CRT inserted and with the front mask separated from the carrier body.
Figure 19:
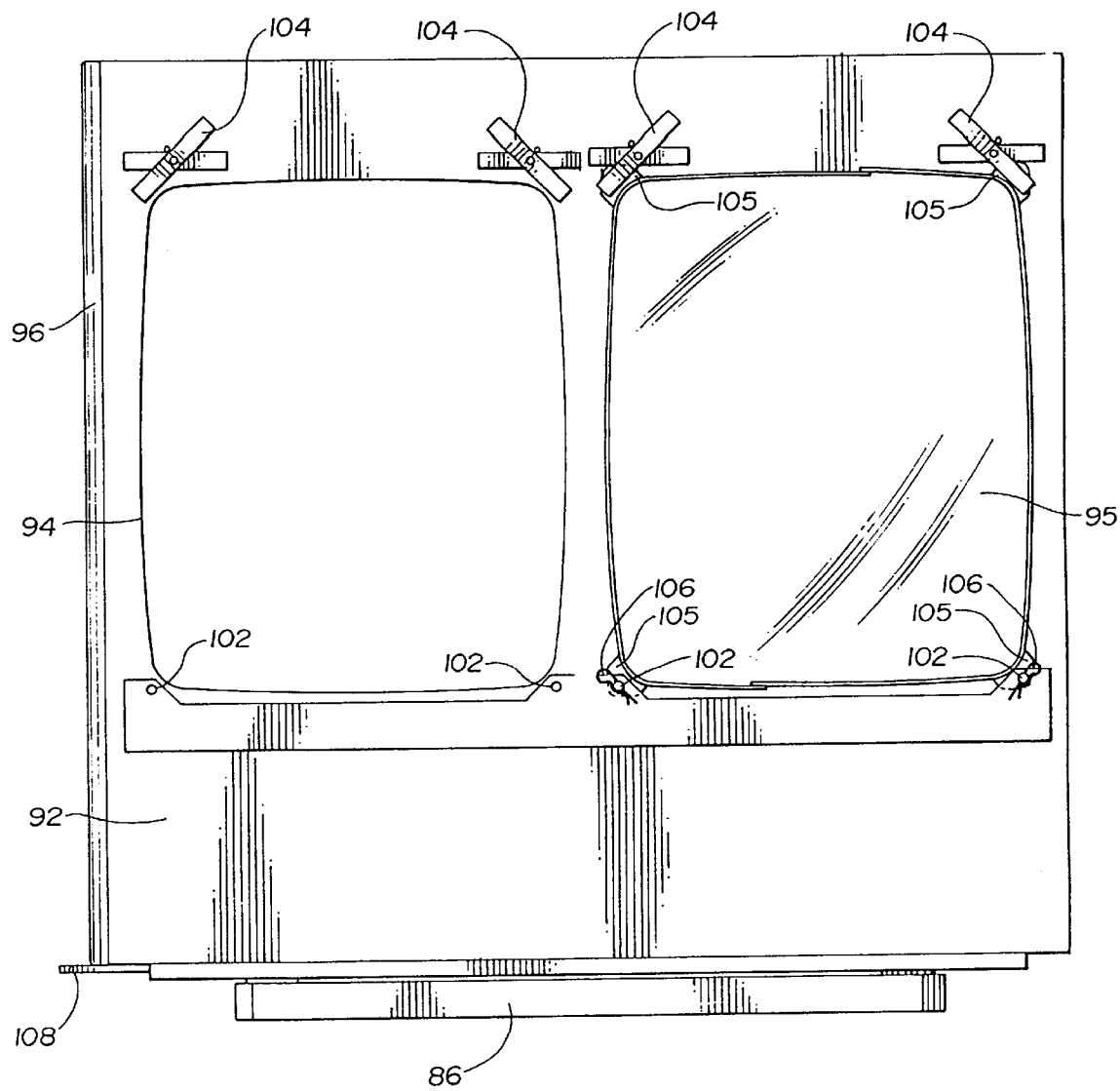
FIG. 19 is an elevational front view of the alternate carrier of FIG. 18 with the front mask removed.
Figure 20:
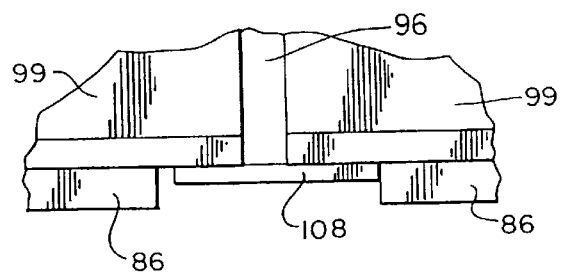
FIG. 20 is an enlarged fragmentary front elevational view showing the connecting relationship between adjacent carriers of the design of FIGS. 18 and 19.

FIGS. 18, 19 and 20 illustrate a further embodiment of a CRT carrier. Specifically, as shown best in FIG. 18, the carrier 85 includes a base 86 and generally box-like structure comprising a top wall 88, a bottom wall 89 and a pair of side walls 90, 91. Joined with the walls 88–91 is a barrier plate 92 having a pair of CRT receiving or mounting openings 94, 94. A CRT illustrated in phantom by the reference character 95 is shown mounted within one of the openings 94. The outside surface of the wall 90 is provided with an elongated seal or gasket member 96 for sealing engagement with the exterior of the wall 91 of an adjacent carrier. Preferably, the seal 96 is constructed of silicon or Viton in order to minimize outgassing.

The bottom wall 89 is connected with a base 86 which includes means on its bottom surface for engagement with the linear drive means of the apparatus illustrated in FIG. 1. The base 86 is provided with a counter weight 98 to provide stability to the carrier. Adjacent to the forward face of the barrier plate 92 is a mask 99 having a pair of openings 100, 100 aligned with the opening 94, 94. The mask 99 is designed to be connected to the forward edges of the walls 88–91 by a plurality of latch or other connection means 101. Preferably, the mask 99 is spaced forwardly from the plate 92 a distance approximately equal to the curvature of the CRT 95 which extends forward of the front surface of the barrier plate 92. A lower surface of the bottom wall 89 is provided with a lip 108 which extends outwardly past the wall 91 for mating engagement with an adjacent carrier as shown in FIG. 20.

FIG. 19 is a front elevational view of the carrier 85 with a mounted CRT 95. As shown, means for mounting the CRT 95 to the plate 92 includes a plurality of support pins 102 adapted to extend through openings in two of the mounting ears 105 of each CRT. Keepers or cotter pins 106 are then inserted through openings in the pin ends to retain the ears 105 on the pins 102. A second pair of CRT mounting ears 105 are retained by pivotable latches 104.

The preferred and alternate embodiments of the present invention described above may be characterized as straight-line linear devices in which the path along which the CRTs move through the apparatus is a generally straight-line linear path. It should be noted, however, that the advantages of the present invention can also be achieved with respect to curvilinear devices in which the path of the CRTs through the apparatus would follow a curved or curvilinear path. Thus, the term linear or linear path as used herein is intended to include both straight-line as well as curvilinear paths having a starting or entrance end and an ending or exit end. It is also contemplated that the advantages and benefits of the present invention can be utilized with an apparatus having a circular or closed loop path. An example of such an apparatus is illustrated schematically in FIGS. 21, 22 and 23.

Figure 21:
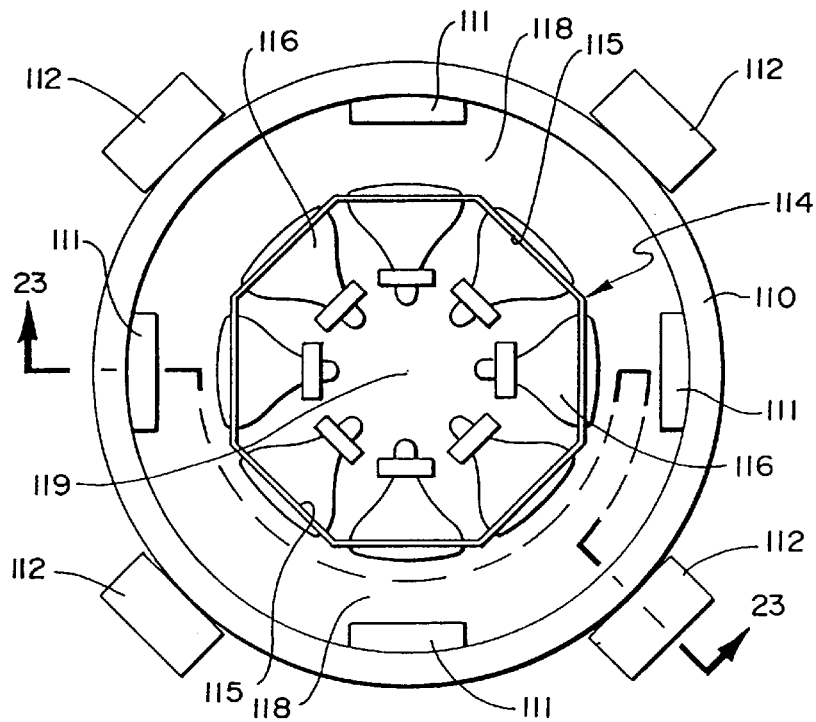
FIG. 21 is a schematic top illustration of an alternate embodiment of an apparatus in accordance with the present invention showing a circular or closed loop coating path.
Figure 22:
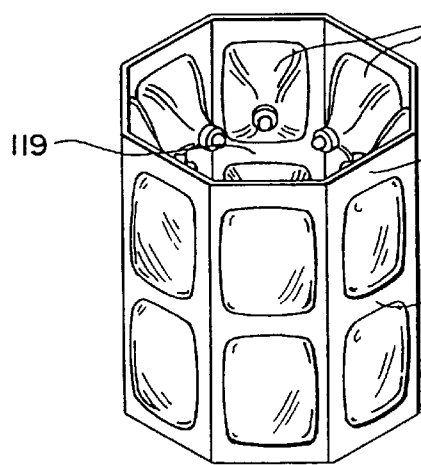
FIG. 22 is an isometric schematic illustration of the CRT supporting carousel used in the apparatus of FIG. 21.
Figure 23:
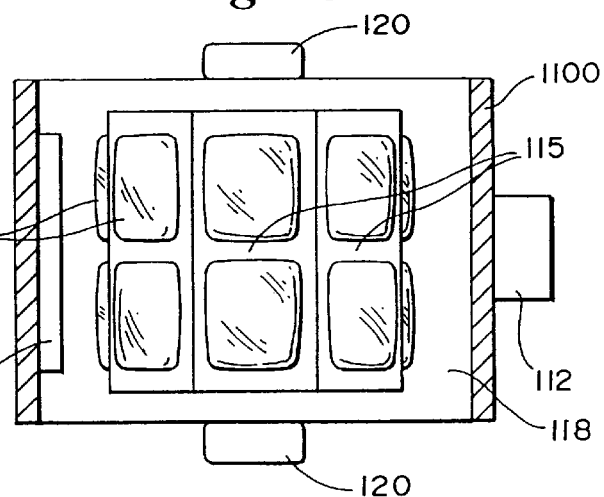
FIG. 23 is a schematic illustration, partially in section, of the apparatus embodiment of FIG. 21 as viewed along the section lines 23—23 of FIG. 21.

The apparatus shown in FIGS. 21–23 includes a generally circular or closed loop coating device housing illustrated schematically by the reference character 110. The housing 110 includes a plurality of coating devices 111 positioned along the interior of the housing 110 with their coating heads facing inwardly. In the preferred embodiment, it is contemplated that these coating devices 111 would be sputtering devices having rotatable sputtering cathodes. The housing 110 is also provided with a plurality of process pumps 112. Spaced inwardly from the housing 110 is a centrally positioned CRT support carousel illustrated generally by the reference character 114. The carousel 114 includes a plurality of CRT carriers 115 each embodying a pair of openings to receive mounted CRTs 116. In the preferred embodiment, the carriers 115 extend substantially throughout the entire height the housing 110 and are joined to one another in edge-to-edge relationship as shown to form a substantially continuous barrier. The area between the barrier and the housing 110 defines a deposition zone 118. The barrier formed by the plurality of carriers 115 also defines an exhaust zone 119 (FIGS. 21 and 22) within the interior of the carousel 114. As illustrated in FIG. 23, the exhaust zone 119 is provided with exhaust pumps 120 for maintaining desirable pressure/vacuum conditions within the exhaust zone 119.

As described above, a principal object of the present invention is to provide an apparatus and method in which the deposition zone and the exhaust zone are substantially isolated or separated from one another. This prevents or minimizes interference of the deposition process by outgasses from noncoated portions of the article such as an assembled CRT. Substantial isolation or separation of the deposition and exhaust zones in accordance with the present invention can be accomplished in several ways. First by physically separating the two zones by minimizing the gaps between adjacent carrier side edges and between top and bottom carrier edges and the process chamber walls, a partial pressure differential between outgas gases and process gases across the physical barrier is created. A second way is by maintaining a total pressure differential between the deposition and exhaust zones so that prevailing movement of gasses within the process chamber during operation is from the deposition zone to the exhaust zone; and third, by combining the physical separation with the maintenance of a pressure differential. The presence of the barrier also functions to confine the deposition zone, thereby facilitating control of the coating process parameters and to prevent the rear or funnel portion of the CRT from being coated.

Physical separation can be maximized by sealing the barrier plate 61 to the article to be coated as shown in FIGS. 8–10, 13 and 14 and by minimizing the gaps between the side edges of adjacent carriers 58 and between the mating top and bottom edges of carriers and barrier portions of the process chamber. Small gaps can, however, be tolerated, particularly if combined with a pressure differential between the deposition and exhaust chambers. Preferably, gaps between the barrier plate 61 and the CRT and between the carrier 58 and mating portions of the process chamber should be maintained at less than about 6 mm and more preferably less than about 3 mm and most preferably less than about 1.5 mm. The size of the gap that can be tolerated, however, will depend on the amount of pressure differential between the deposition and exhaust zones and the proximity of the gap to the surface to be coated. A further factor involves the shape of the gap which affects the conductance of the gap. For example, the movement of gases between zones can be reduced by a serpentine shaped gap or by increasing the length over which the gap is maintained.

In the preferred embodiment, the deposition and exhaust zones 33 and 54 are provided with separate pumping systems, 50 and 56 (FIG. 11) respectively. The provision of separate pumping systems facilitates the pressure differential. In the preferred embodiment, the pressures in the deposition zone 33 are maintained in the general range of about $1 \times 10^{-3}$ to $8 \times 10^{-3}$ Torr. In the exhaust zone 54, pressures are preferably maintained in a general range of about $5 \times 10^{-5}$ to $7 \times 10^{-4}$ Torr. Preferably, the pressure differential between the zones is such that the deposition zone pressure or partial pressure exceeds the exhaust zone pressure or partial pressure by a factor of at least two and more preferably at least five.

Having described the structure of the present apparatus, the operation of the apparatus and the method of the present invention can be understood best as follows.

First, in accordance with the method of the preferred embodiment, a fully assembled CRT 42 is mounted to a CRT carrier 58 as illustrated in the embodiment of FIGS. 2, 3 and 4 or any one of the various alternate embodiments. For this purpose, the carrier may be a single CRT carrier 58 as shown in FIGS. 2–6 or may be a double CRT carrier 58 as illustrated in the schematic view of FIG. 7 or the alternate carrier of FIG. 18. In either case, the carrier is provided with a barrier plate having an opening substantially conforming in size and configuration to a peripheral surface of the CRT 42. A forwardly spaced mask or shield member 70 (FIGS. 7 and 16) or 99 (FIG. 18) with openings may also be provided. Alternatively, the mask can be eliminated as shown in the embodiment of FIGS. 15 and 17. In the embodiment of FIGS. 7 and 16, a film 74 may optionally be provided between the openings 71 and 64 to improve isolation of the deposition zone 33 and the front face 41 of the CRT 42 from contaminating outgasses. Although it is desirable for the opening 64 in the barrier plate 61 to be sealed to a peripheral surface of the CRT 42, a total seal is not necessary. In fact, a small gap can be tolerated. Preferably, however, the partial pressures of gasses within the deposition zone 33 and the exhaust zone 54 are such as to preclude or minimize migration of outgasses from the exhaust zone 54 into the deposition zone 33.

Figure 5:
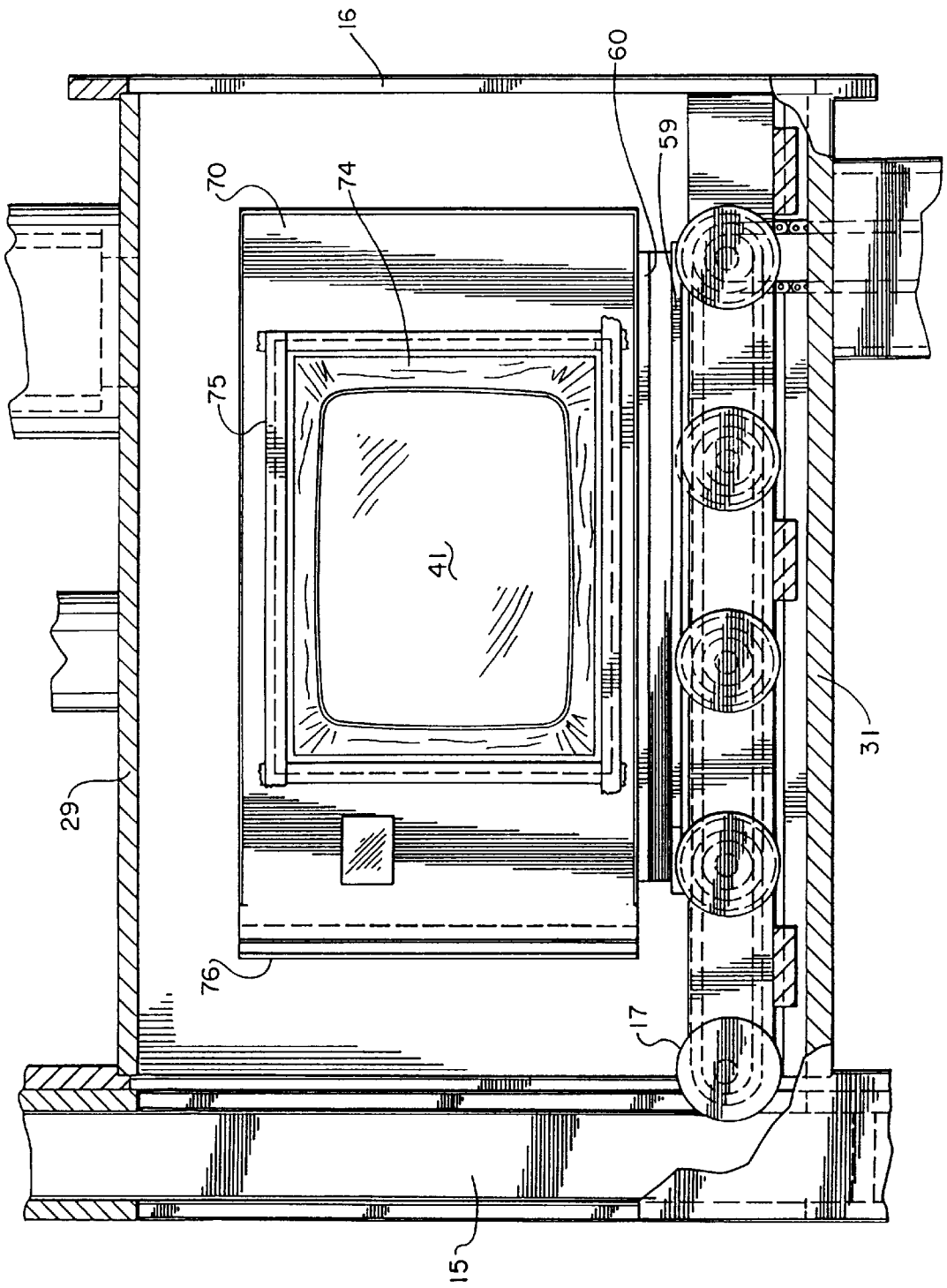
FIG. 5 is a front elevational view of the CRT carrier of FIG. 2 positioned within the entry buffer chamber of the apparatus of FIG. 1.

After the CRT 42 has been mounted to the CRT carrier, the gate valve 16 (FIG. 1) is closed and the air supply means 20 is actuated to provide the interior of the entry buffer chamber 12 with atmospheric pressure. The door 15 is then opened and the carrier 58 with the attached CRT 42 is positioned within the entry buffer zone 12 as illustrated in FIGS. 5 and 6. In this position, the base 59 of the carrier 58 is positioned on the transport rollers 17. The door 15 is then closed and latched and the air exhaust means 21 actuated to create vacuum conditions within the chamber 12 substantially identical to those within the process chamber 11. The gate valve 16 is then raised and the carrier with mounted CRT 42 is transported into the process section 11 so that it abuts an adjacent carrier. If desired, a dynamic seal between adjacent carriers as they enter and exit the process chamber 11 can be provided. If CRTs or other articles to be coated are not intended to be mounted in each carrier opening, dummy carriers can be provided with glass inserts covering the CRT mounting openings. When the carrier 58 and CRT 42 are positioned within the section 11, the gate valve 16 may be closed, the chamber 12 brought to atmospheric pressure and a new carrier and CRT introduced into the chamber 12 to repeat the cycle.

If CRTs or other articles to be coated are not intended to be mounted in each carrier opening, dummy carriers can be provided with glass inserts covering the CRT mounting openings.

Within the section 11, the carrier 58 and CRT 42 are progressively moved along so that the front face 41 of the CRT is progressively moved past the various coating devices 34 within the deposition zone 33 for sequential deposition of a thin film coating by the sputtering cathodes 36 and 39. Because it is possible and common for adjacent coating devices 34 to utilize different working gasses, as well as different materials, it is preferable for each of the devices 34 to be provided with separate evacuation pumps or pump systems 50 (FIG. 11).

To minimize the contamination of working gasses and the like from one coating apparatus 34 to another, it is preferable during movement of the CRTs through the section 11 for the mask or shield portion 70 of the carrier 58 to be positioned as close to the walls 45 and 46 as possible.

Figure 11:
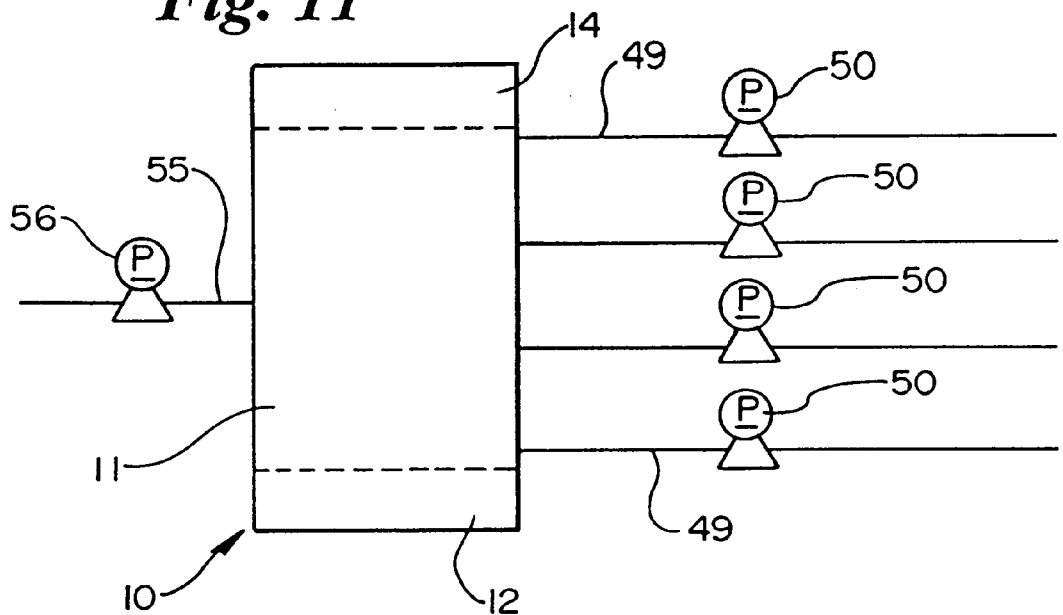
FIG. 11 is a schematic illustration of the apparatus of the present invention showing the vacuum pumps connected with the deposition and exhaust zones.

During the deposition process reduced pressure conditions are maintained within the devices 34, and thus the deposition zone 33, by the vacuum pumps 50 (FIG. 11) and in the exhaust zone 54 by the vacuum pump 56 (FIG. 11). Preferably, the pressure levels maintained in the deposition zone 33 are slightly greater than that in the exhaust zone 54 so that a pressure differential is created. Thus, the prevailing movement of gases, etc., although minimized, is from the deposition zone 33 to the exhaust zone 54.

In the above identified apparatus and method, to the extent outgasses are released from electronic and other components of the assembled CRT 42, they are essentially isolated, either fully or partly, from the deposition process zone 33. Thus, such outgasses are effectively prevented from interference with the deposition process. This represents a significant advancement in the art and facilitates the thin film coating of an article such as a CRT screen after the CRT has been substantially assembled. Further, the maintenance of a moving barrier through the process zone effectively reduces the size of the deposition zone and thereby facilitates improved control of the process parameters. Still further, by maintaining minimal gaps between the moving barrier and various wall surfaces and portions of the chamber 11 and the devices 34, substantial isolation between adjacent coating devices can be maintained.

Although the description of the preferred embodiment and method have been quite specific, it is contemplated that various modifications could be made without deviating from the spirit of the present invention. Accordingly, it is intended that the scope of the present invention be dictated by the appended claims rather than by the description of the preferred embodiment.

We claim:

1. An in line coating apparatus for providing a thin film coating to an assembled cathode ray tube in which said cathode ray tube includes an outer front face portion to be coated and a rearward funnel portion comprising the remaining surface of said cathode ray tube to remain substantially uncoated, said apparatus comprising:

a process chamber having an entry end and an exit end;

a linear drive mechanism extending through said process chamber from said entry end to said exit end;

a plurality of generally vertically oriented thin film deposition devices positioned in spaced relationship to each other along one side of said process chamber between said entry end and said exit end; and a plurality of cathode ray tube carriers moveable through said process chamber from said entry end to said exit end via said linear drive mechanism and each adapted to carry at least one cathode ray tube, each of said carriers including at least one cathode ray tube support to support an assembled cathode ray tube with its front face generally vertically oriented adjacent to and facing said vertically oriented thin film deposition devices so that a thin film coating is applied to said front face during movement of said carrier from said entry end to said exit end and with its rearward funnel portion facing away from said vertically oriented thin film deposition devices so that said rearward funnel portion remains free of coating during movement of said carrier from said entry end to said exit end.

2. The apparatus of claim 1 wherein said process chamber extends in a substantially straight line path from said entry end to said exit end.

3. The apparatus of claim 1 including an entry chamber adjacent to said entry end and an exit chamber adjacent to said exit end.

4. The apparatus of claim 1 wherein said at least one cathode ray tube support includes a support member having an opening conforming substantially to a size of said front face.

5. The apparatus of claim 1 wherein said linear drive mechanism comprises a plurality of rotatable wheels.

6. The apparatus of claim 1 wherein each of said carriers includes a plurality of cathode ray tube supports.

7. The apparatus of claim 1 wherein each of said plurality of carriers is independently moveable through said process chamber.

8. The apparatus of claim 1 wherein said thin film coating is an anti reflective coating.

9. The apparatus of claim 2 including an entry chamber adjacent to said entry end and an exit chamber adjacent to said exit end.

10. The apparatus of claim 9 wherein said at least one cathode ray tube support includes a support member having an opening conforming substantially to a size of said front face.

11. The apparatus of claim 10 wherein said linear drive mechanism comprises a plurality of rotatable wheels.

12. The apparatus of claim 11 wherein each of said carriers includes a plurality of cathode ray tube supports.

13. The apparatus of claim 12 wherein each of said plurality of carriers is independently moveable through said process chamber.

14. The apparatus of claim 13 wherein said thin film coating is an anti reflective coating.

15. The apparatus of claim 10 wherein said thin film coating is an anti reflective coating.

16. The apparatus of claim 15 wherein said plurality of thin film deposition devices are sputtering devices.

17. The apparatus of claim 1 wherein said front face remains free of contamination from said rearward funnel portion during movement of said carrier from said entry end to said exit end.

18. A method of applying a thin film coating to a front face portion of an assembled cathode ray tube having said front face portion to be coated and a rearward funnel portion comprising the remaining surface of said cathode ray tube to remain substantially uncoated, said method comprising the steps of:

providing a deposition process chamber having an entry end, an exit end and a plurality of vertically oriented thin film deposition devices along one side of said process chamber;

providing a plurality of separate cathode ray tube carriers, each having a cathode ray tube mount to support an assembled cathode ray tube with its front face generally vertically oriented and positioned on one side of said carrier;

mounting an assembled cathode ray tube onto said cathode ray tube mount so that the front face portion of said assembled cathode ray tube is generally vertically oriented so that a thin film coating is applied to said front face during movement of said carrier from said entry end to said exit end and so that its rearward funnel portion faces away from said deposition devices so that said rearward funnel portion remains free of coating during movement of said carrier from said entry end to said exit end and moving said plurality of carriers through said process chamber from said entry end to said exit end with said vertically oriented front face portion directly adjacent to said plurality of deposition devices during movement through said process chamber.

19. The method of claim 18 wherein the step of moving said plurality of carriers includes moving said plurality of carriers through said process chamber with said front face remaining free of contamination from said rearward funnel portion.

* * * * *